United States Patent [19]
Kishi

[11] Patent Number: 5,148,382
[45] Date of Patent: Sep. 15, 1992

[54] INFINITE IMPULSE RESPONSE DIGITAL FILTER

[75] Inventor: Takahiko Kishi, Tokyo, Japan

[73] Assignee: Kabushiki Kaisha Kenwood, Tokyo, Japan

[21] Appl. No.: 535,155

[22] Filed: Jun. 8, 1990

[30] Foreign Application Priority Data

Jun. 8, 1989 [JP] Japan .................. 1-146478

[51] Int. Cl.⁵ .............................................. G06F 7/38
[52] U.S. Cl. .............................................. 364/724.03
[58] Field of Search ............... 364/724.03, 745, 724.17

[56] References Cited

U.S. PATENT DOCUMENTS

| | | | |
|---|---|---|---|
| 4,195,350 | 3/1980 | Moore | 364/724.03 |
| 4,321,685 | 3/1982 | Kasuga et al. | 364/724.03 |
| 4,809,207 | 2/1989 | Nillesen | 364/724.03 |
| 4,920,507 | 4/1990 | Takeda | 364/724.03 X |

Primary Examiner—Tan V. Mai
Attorney, Agent, or Firm—Sixbey, Friedman, Leedom & Ferguson

[57] ABSTRACT

A digital filter including an Infinite Impulse Response (IIR) digital filter; limit cycle suppression signal generating means for generating a limit cycle suppression signal whose amplitude level is larger than a critical input amplitude level in a dead band range in which an output of the IIR digital filter is set to a dead band amplitude level and whose frequency component exists in only a useless frequency band of a signal system; and adding (subtracting) means for adding (subtracting) an input signal to be inputted to the IIR digital filter and the limit cycle suppression signal and for inputting an output to the IIR digital filter.

5 Claims, 4 Drawing Sheets

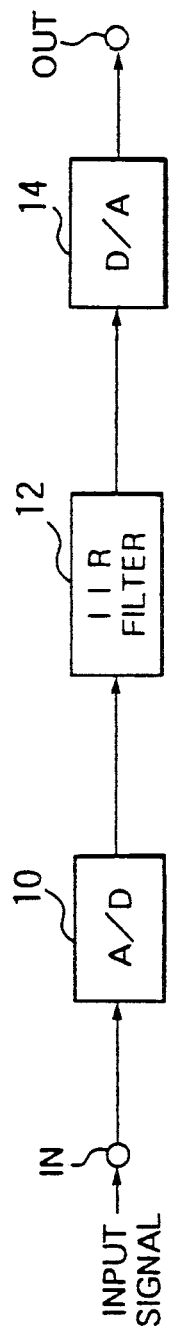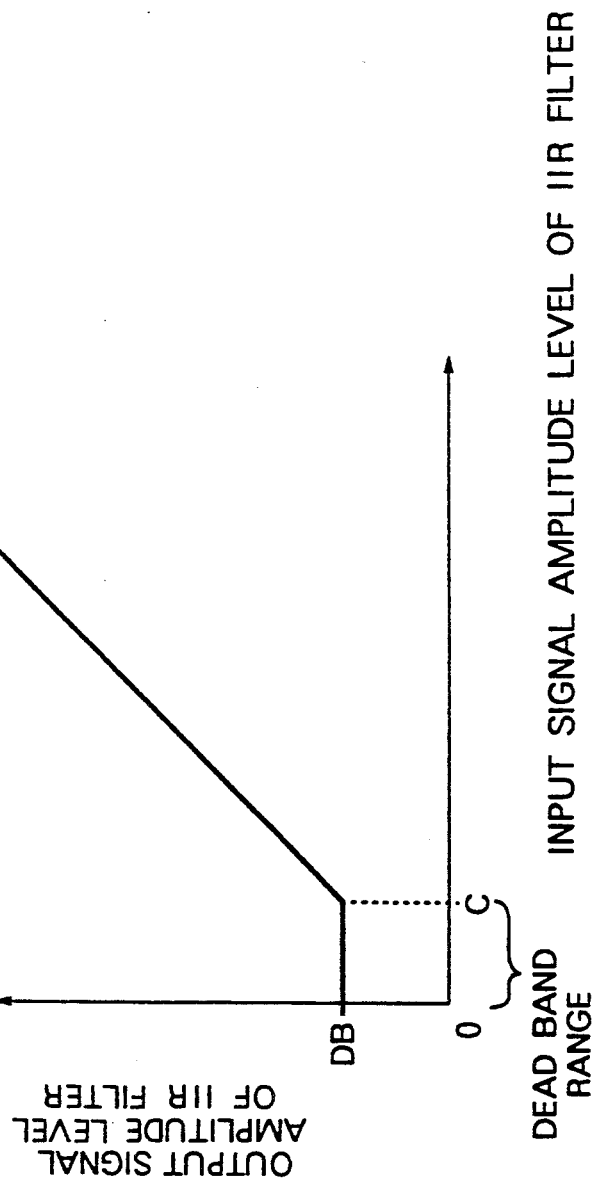
FIG. 6
PRIOR ART
FIG. 7
PRIOR ART

INFINITE IMPULSE RESPONSE DIGITAL FILTER

BACKGROUND OF THE INVENTION

1. Field of the Invention

The present invention relates to a digital filter and, more particularly, to an IIR (Infinite Impulse Response) digital filter.

2. Related Art

In recent years, a digital filter which realizes the functions of an analog low pass filter, a band pass filter, and a high pass filter by a region of digital signal processes has been fairly widely used.

The digital filter is mainly classified into an FIR type (Finite Impulse Response type) (non-recursive type) and an IIR type (recursive type). In the case of the IIR type, it is known that when the digital filter is constructed by an arithmetic unit of a finite word length, even if an amplitude level of an input signal is set to zero after a certain time, an amplitude of an output of the digital filter is not attenuated to zero but an amplitude component is output (such a state is called a limit cycle phenomenon).

Such an amplitude component output is observed as a residual noise when a zero level signal is input to the IIR digital filter.

An amplitude level (dead band amplitude level DB) of a limit cycle signal of a primary IIR digital filter whose difference equation is given by the following equation as an example.

$$y(t) = -a \cdot y(t-1) + x(t)$$

$$(t = 1, 2, \ldots, |a| < 1) \quad (1)$$

is as follows.

$$|y_Q(t-1)| \leq (\tfrac{1}{2}) \cdot 2^{-b}/(1-|a|)$$

$y_Q(t)$: quantized output signal,
$2^{-b}$: quantizing step,
$b$: quantized bit number  (2)

For instance, as shown in FIG. 6, it is assumed that there is a digital low pass filter in which after an input analog signal was converted into a digital signal by an A/D converter 10, the digital signal is input to an IIR digital filter 12 and only a low band component is allowed to pass, and the digital signal is further converted into the original analog signal by a D/A converter 14 and the analog signal is output. In this case, as shown in FIG. 7, in a range in which an amplitude level of an input signal is set to a predetermined critical input level C or higher, the amplitude level of the input signal and the amplitude level of the output signal proportionally change. However, when the amplitude level of the input signal is set to the critical input level C or lower, even if the input level decreases, the amplitude level of the output signal does not decrease and an output which is independent of the input shown by the above equation appears.

As will be understood from the equation (2), as the quantizing step is small, the dead band output amplitude level DB also decreases and, when $a < \tfrac{1}{2}$, no limit cycle occurs.

However, when the quantizing step is reduced, the number of bits which are necessary for operations increases, so that a construction of the digital filter enlarges in size and becomes complicated.

On the other hand, if a coefficient of the digital filter is held to a value of 0.5 or less such as not to cause a limit cycle, this means that the filter characteristics are limited.

The invention is made in consideration of the conventional problems as mentioned above and it is an object of the invention to provide a digital filter in which a limit cycle can be suppressed for an IIR digital filter without increasing the number of bits nor limiting the filter characteristics.

Another object of the invention is to provide a filter apparatus of a simple construction.

Further another object of the invention is to enable a limit cycle to be effectively suppressed for a cascade connected type IIR digital filter without increasing the number of bits nor limiting the characteristics.

SUMMARY OF THE INVENTION

A digital filter according to the invention comprises: an IIR digital filter; limit cycle suppression signal generating means for generating a limit cycle suppression signal which has an amplitude level larger than a critical input amplitude level in a dead band range in which an output changes even when an input to the IIR digital filter is changed and whose frequency component exists in only a useless frequency band of an input/output signal system of the digital filter; and adding (subtracting) means for adding (subtracting) an input signal which is input to the IIR digital filter and the limit cycle suppression signal and for inputting to the IIR digital filter.

On the other hand, it is a feature of another digital filter of the invention that the frequency component of the limit cycle suppression signal exists in only a rejection band of the IIR digital filter.

It is a feature of further another digital filter of the invention that a frequency of the limit cycle suppression signal is set to a frequency which is n/2 (n=1, 3, 5, ...) times as high as the sampling frequency of the IIR digital filter.

It is a feature of still another digital filter of the invention that the IIR digital filter executes an input of a limit cycle suppression signal for only the necessary stages in a plurality of cascade connected IIR digital filters.

BRIEF DESCRIPTION OF THE DRAWINGS

FIG. 6 is a block diagram of a conventional digital filter; and

FIG. 7 is a diagram showing the input/output characteristics in the case where a limit cycle phenomenon occurs in an IIR digital filter of a conventional technique in FIG. 6.

DETAILED DESCRIPTION OF THE EMBODIMENTS

The first embodiment of the present invention will be described hereinbelow with reference to FIG. 1.

Figure 1:
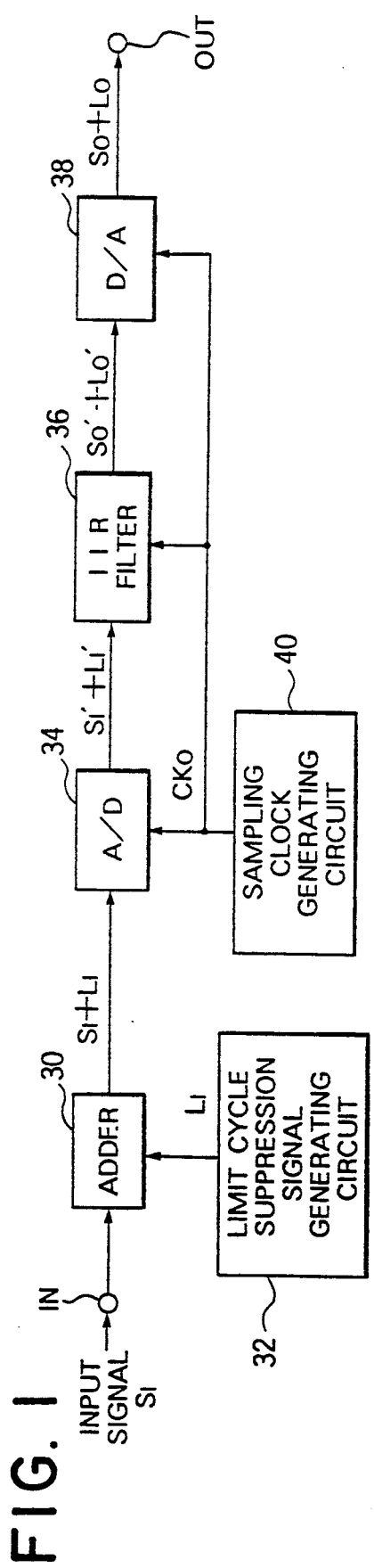
FIG. 1 is a block diagram of a digital filter according to the first embodiment of the invention.

FIG. 1 is a block diagram showing a digital filter according to the invention.

An adder 30 is connected to an input terminal IN to which an analog input signal $S_I$ is input. An analog limit cycle suppression signal $L_I$ generated by a limit cycle suppression signal generating circuit 32 and the input signal $S_I$ are added.

An A/D converter 34 is connected to the output side of the adder 30. An analog output of the adder 30 is converted into a digital signal by the A/D converter 34.

An output of the A/D converter 34 is a signal which is obtained by adding a digital input signal component $S_I'$ and a digital limit cycle suppression signal component $L_I'$.

An IIR digital filter 36 is connected to an output side of the A/D converter 34. The digital signal outputted from the A/D converter 34 is filtered by the IIR digital filter 36 in accordance with predetermined filter characteristics thereof.

Since the IIR digital filter 36 executes an operation by a finite word length, when an amplitude of an input signal of the IIR digital filter 36 is smaller than a critical input level C (refer to FIG. 2) in a dead band range, an oscillating component occurs in an output due to a limit cycle phenomenon. Thus, an amplitude level of an output signal does not decrease to a dead band amplitude level DB or lower (refer to FIG. 2). A D/A converter 38 is connected to the output side of the IIR digital filter 36. The digital signal after completion of the digital filtering process is converted into the analog signal.

The A/D converter 34, IIR digital filter 36, and D/A converter 38 operate in accordance with clocks $CK_0$ of a sampling frequency $f_s$ which are generated from a sampling clock generating circuit 40.

The operation of the embodiment will now be described with reference to FIGS. 2 and 3.

Figure 2:
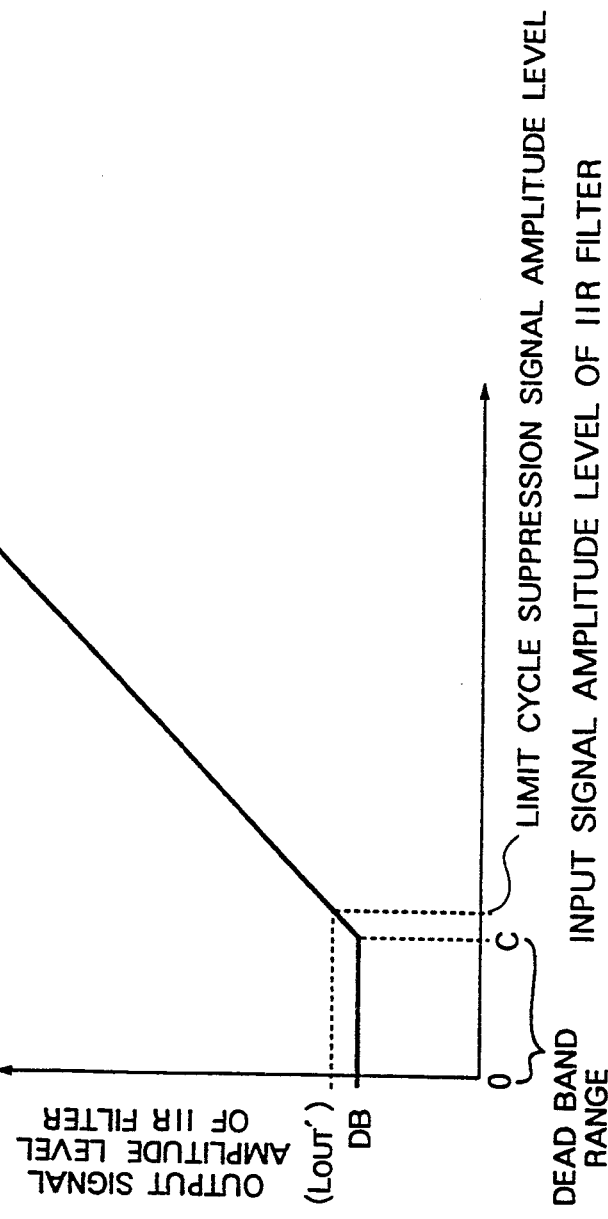
FIG. 2 is a diagram showing the relations among the input/output characteristics in an IIR digital filter, the critical input level C, the dead band amplitude level DB, and the limit cycle suppression signal level.

FIG. 2 is a diagram showing input/output characteristics in the case where a limit cycle of the IIR digital filter 36 in FIG. 1 occurs. FIG. 3 is a diagram showing input/output characteristics of the digital input signal component $S_I'$ and the digital output signal component $S_0'$ of the IIR digital filter 36.

It is assumed that an amplitude level of the limit cycle suppression signal $L_I$ which is generated by the limit cycle suppression signal generating circuit 32 is larger than the critical input amplitude level C of the IIR digital filter 36 by only a very small amount (refer to FIG. 2) and the frequency component of the limit cycle suppression signal $L_I$ is limited to only the useless frequency band of the signal system including the digital filter.

First, as a first embodiment, explanation will now be made with respect to the case where the frequency component of the limit cycle suppression signal $L_I$ exists in a pass band of the IIR digital filter 36.

For instance, it is now assumed that the IIR digital filter 36 is a high pass filter and a frequency band of a frequency $f_p$ or lower is set to a rejection band and a frequency band of a frequency $f_c$ or higher is set to a pass band ($f_p < f_c < (\frac{1}{2}) \cdot f_s$). Consideration will now be made with respect to the case where a frequency band of an input signal S is limited to a range smaller than $(\frac{1}{2}) \cdot f_s$. The frequency of the limit cycle suppression signal $L_I$ is set to a single frequency $f_L = (\frac{1}{2}) \cdot f_s$ (in which, $f_L > f_c$) and lies within the pass band of the IIR digital high pass filter 36. However, this frequency exists in the useless frequency band of the signal system containing the digital high pass filter. Consideration will now be made with regard to the case where on the output side of the digital filter, a high frequency band including the $f_L$ component is blocked as a useless frequency band of the signal system by another analog filter.

The limit cycle suppression signal $L_I$ generated by the limit cycle suppression signal generating circuit 32 is added to the input signal S by the adder 30 and, thereafter, the addition signal is converted into the digital signal by the A/D converter 34. The digital signal is input to the IIR digital filter 36.

Therefore, a digital limit cycle suppression signal component $L_I'$ having an amplitude which is always larger than the critical input level C in the dead band region irrespective of the amplitude level of the input signal $S_I$ is input to the IIR digital high pass filter 36. Thus, no limit cycle phenomenon occurs in the IIR digital filter 36.

In the IIR digital filter 36, the digital input signal component $S_I'$ and a digital limit cycle suppression signal component $L'$ are filtered in accordance with predetermined characteristics of the digital filter and are output as a digital signal component $S_0'$ and a digital signal component $L_0'$, respectively.

Figure 3:
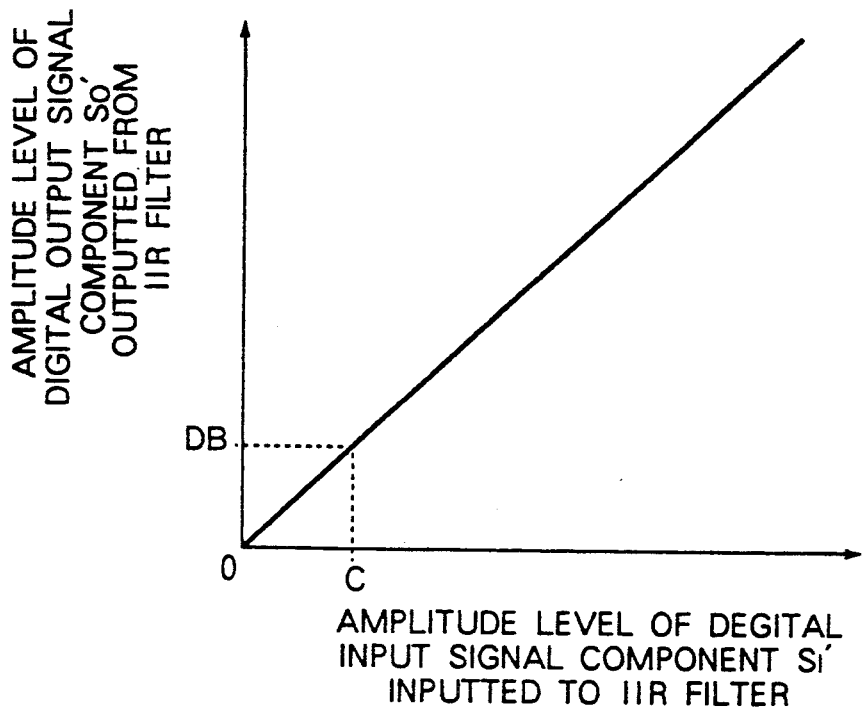
FIG. 3 is a diagram showing the operation of the digital filter of FIG. 1.

In this case, since no limit cycle phenomenon occurs, even if the amplitude level of the digital input signal $S_I'$ decreases than the critical input level C, the amplitude level of the digital output signal component $S_0'$ after completion of the filtering process can decrease than the dead band amplitude level DB in proportion to the level of the digital input signal (refer to FIG. 3).

The digital signal components $S_0'$ and $L_0'$ are converted into the analog signal components $S_0$ and $L_0$ by the D/A converter 38 and are input to the analog signal system at the post stage. However, by eliminating the frequency components higher than the frequency $F_L$ component by an analog filter at the post stage, only the necessary signal components can be obtained.

The case where all of the frequency components of the limit cycle suppression signal $L_I$ exist in the rejection band of the IIR digital filter 36 will now be described as a second embodiment.

For instance, consideration will be made with respect to the case where the IIR digital filter 36 is a high pass filter, a frequency band of a frequency $f_p$ or lower is set to a rejection band, a frequency band of a frequency $f_c$ or higher is set to a pass band ($f_p < f_c < (\frac{1}{2}) \cdot f_s$), the frequency band of the input signal S is limited to a range smaller than $((\frac{1}{2}) \cdot f_s)$, the frequency of the limit cycle suppression signal $L_I$ is set to the single frequency $f_L$, and $F_L < f_p$.

In a manner similar to the above, after the limit cycle suppression signal $L_I$ generated by the limit cycle suppression signal generating circuit 32 was transmitted through the adder 30 and converted into the digital signal by the A/D converter 34, it is always input to the IIR digital filter 36, so that no limit cycle phenomenon occurs in the IIR digital filter 36.

In the IIR digital filter 36, the digital input signal component $S_I'$ and digital limit cycle suppression signal component $L'$ are filtered in accordance with predetermined filter characteristics. The former digital input signal component is output as a digital signal component $S_0'$.

Since the latter digital limit cycle suppression signal component L' lies within the rejection band of the IIR digital filter 36, it is not output.

Since no limit cycle phenomenon occurs, even when the amplitude level of the digital input signal component S' decreased than the critical input level C, the amplitude level of the digital signal component $S_0'$ after completion of the filtering process can decrease than the dead band output amplitude level DB in proportion to the input level (refer to FIG. 3).

Although the digital signal component $S_0'$ is converted into the analog signal component $S_0$ by the D/A converter 38 and is input to the signal system at the post stage. However, since the limit cycle suppression signal component $L_0$ is not output, there is no need to provide any special filter to eliminate the limit cycle suppression signal $L_0$ on the post stage side.

According to the embodiment, the limit cycle suppression signal $L_I$ whose amplitude is larger than the critical input level C in the dead band range of the IIR digital filter 36 by only a small amount and which has only the frequency components in the useless frequency band of the signal system is generated by the limit cycle suppression signal generating circuit 32. The limit cycle suppression signal $L_I$ and the input signal $S_I$ are added by the adder 30 and, thereafter, the addition signal is converted into the digital signal by the A/D converter 34 and is input to the IIR digital filter 36. Therefore, the amplitude level signal of the critical input level C or higher is always input to the IIR digital filter 36 irrespective of the decrease in amplitude level of the input signal $S_I$. Thus, no limit cycle phenomenon occurs in the IIR digital filter 36. Even when the amplitude level of the input signal $S_I$ decreased lower than the critical input level C, the amplitude level of the digital signal component $S_0'$ regarding the input signal $S_I$ after completion of the filtering process can decrease lower than the dead band output amplitude level DB in proportion to the amplitude level of the input signal $S_I$. Moreover, even if the component of the limit cycle suppression signal $L_I$ passed through the IIR digital filter 36, such a component lies within the useless frequency band of the signal system, so that it can be easily eliminated without exerting an adverse influence on the necessary signal components. Therefore, the generation of the limit cycle noises can be suppressed without increasing the number of bits nor limiting the filter characteristics.

On the other hand, by setting the frequency component of the limit cycle suppression signal $L_I$ into the rejection band of the IIR digital filter 36, it is possible to block a state such that the limit cycle suppression signal component is output to the output side of the digital filter. The process to eliminate the limit cycle suppression signal component on the post stage side becomes unnecessary.

In general, since the frequency $((\frac{1}{2}) \cdot f_s)$ is a useless frequency of the signal system including the digital filter, it is also possible to select the single frequency signal of either one of the frequencies $((n/2) \cdot f_s)$ (n=1, 3, 5, ...) or a synthetic signal of those signals as a limit cycle suppression signal.

The signal of each of the frequencies of $((n/2) \cdot f_s)$ (n=1, 3, 5, ...) can be easily obtained in a manner such that the signal of the sampling clocks $CK_0$ generated from the sampling clock generating circuit 38 is frequency divided into $\frac{1}{2}$ and the frequency divided signal is transmitted through a tuning circuit which tunes in a desired frequency. Any special oscillating circuit is unnecessary.

Even if an aliasing spectrum to a Nyquist band at the sampling frequency $f_s$ is set to only $((\frac{1}{2}) \cdot f_s)$ and the signal of each of those frequencies is added to the input signal S and the addition signal is transmitted through the IIR digital filter 36, no aliasing distortion is caused in the output.

Particularly, when the LPF or BPF is constructed by the IIR digital filter 36, the zero point of the gain characteristics of the digital filter is set to a frequency near $((\frac{1}{2}) \cdot f_s)$. Therefore, the limit cycle suppression signal can be easily attenuated by the IIR digital filter 36. The limit cycle suppression signal component appearing in the output of the digital filter can be set to a level which is fairly lower than the dead band amplitude level.

The signal in which all of the frequencies of $((n/2) \cdot f_s)$ (n=1, 3, 5, ...) where synthesized is nothing but a rectangular wave signal in which the sampling clocks $CK_0$ were frequency divided into $\frac{1}{2}$, so that no tuning circuit is necessary as well.

Figure 4:
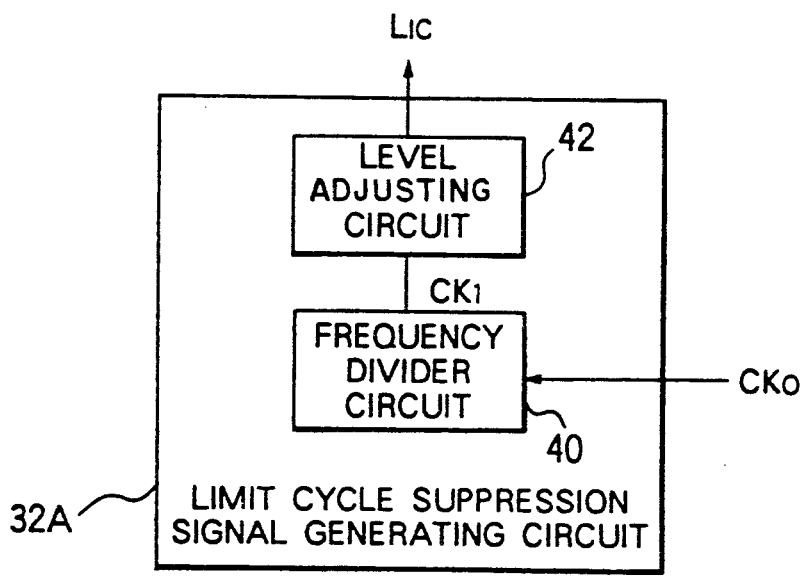
FIG. 4 is a block diagram showing an example of an arrangement of a limit cycle suppression signal generating circuit in FIG. 1.

For example, as shown in FIG. 4, a limit cycle suppression signal generating circuit 32A can be easily constructed by: a $\frac{1}{2}$ frequency divider circuit 40 for frequency dividing the sampling clocks $CK_0$ so as to reduce the frequency into $\frac{1}{2}$ and outputting as clocks $CK_1$; and a level adjusting circuit 42, connected to the output side of the divider circuit 40, for adjusting the amplitude level of the clocks $CK_1$ and outputting as a limit cycle suppression signal $L_{IC}$.

The second embodiment of the invention will now be described with reference to FIG. 5.

Figure 5:
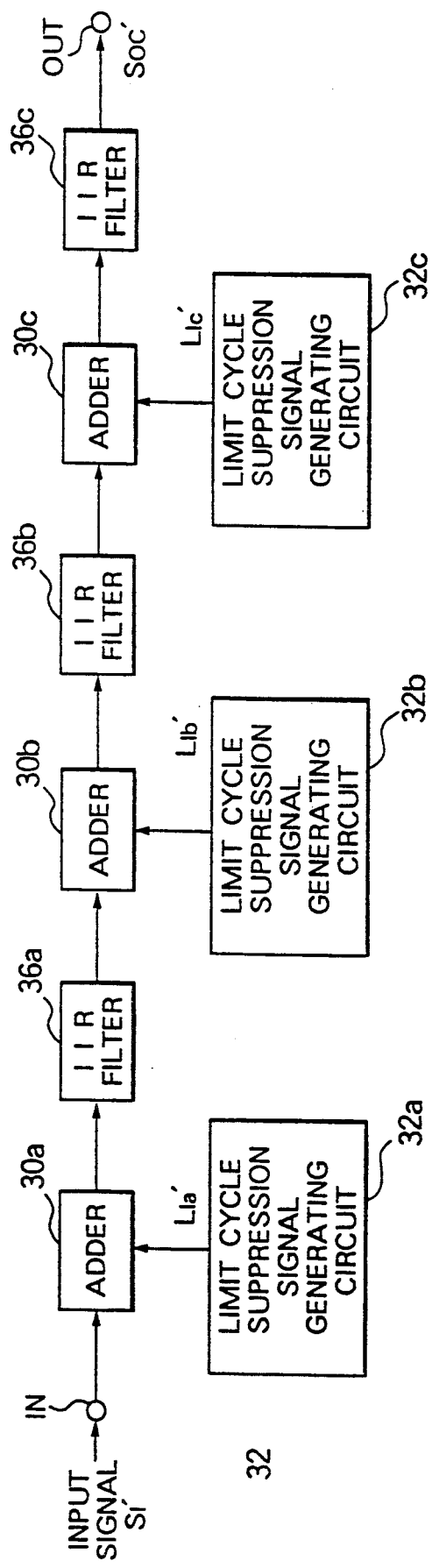
FIG. 5 is a block diagram showing the second embodiment of the invention.

FIG. 5 is a block diagram of an IIR digital filter of the cascade connected type according to the invention.

For instance, three IIR digital filters 36a to 36c are cascade connected and one cascade connected type IIR digital filter is constructed.

An adder 30a is serially inserted on the front stage side of an IIR digital filter 36a at the first stage, an adder 30b is serially inserted to the front stage side of an IIR digital filter 36b at the second stage, and an adder 30c is serially inserted on the front stage side of an IIR digital filter 36c at the third stage.

Each of the IIR digital filters 36a to 36c executes an arithmetic operation by a finite word length. It is now assumed that when the amplitude levels of the input signals decrease to critical input levels $C_a$ to $C_c$ or lower, a limit cycle phenomenon occurs, respectively.

Limit cycle suppression signal generating circuits 32a to 32c are individually connected to the adders 30a to 30c.

The limit cycle suppression signal generating circuits 32a to 32c generate digital limit cycle suppression signals $L_{Ia}'$ to $L_{Ic}'$ whose amplitude levels are larger than the critical input levels $C_a$ to $C_c$ of the corresponding IIR digital filters 36a to 36c by only small amounts and which have frequency components which lie within only the useless frequency band of the signal system. The generating circuits 32a to 32c output the signals $L_{Ia}'$ to $L_{Ic}'$ to the adders 30a to 30c.

Although the adders 30a to 30c execute the addition in the digital region, among them, the adder 30a adds the digital input signal $S_I'$ and the digital limit cycle suppression signal $L_{Ia}'$ and supplies the addition signal to the IIR digital filter 36a at the first stage.

Therefore, even if the amplitude level of the digital input signal $S_I'$ decreases lower than the critical input level $C_a'$ no limit cycle phenomenon occurs in the IIR digital filter 36a. A digital signal component $S_{0a}'$ whose amplitude was reduced lower than the dead band amplitude level in proportion to the decrease in amplitude level of the input signal $S_I'$ is output from the IIR digital filter 36a.

In a manner similar to the above, the adder 30b adds the digital signal $S_{0a}'$ and the limit cycle suppression signal $L_{Ib}'$ and supplies the addition signal to the IIR digital filter 36b at the second stage. Therefore, even if the amplitude level of the digital signal $S_{0a}'$ was reduced lower than the critical input level $C_b'$ no limit cycle phenomenon occurs in the IIR digital filter 36b. A digital signal component $S_{0b}'$ of an amplitude which is proportional to the input signal $S_{0a}'$ and is lower than the dead band amplitude level is output from the IIR digital filter 36b.

In substantially the same manner as above with respect to the IIR digital filter 36c at the third stage, when the amplitude level of the input signal $S_{0a}'$ decreased, a digital signal component $S_{0c}'$ whose amplitude is lower than the dead band amplitude level in proportion to the decrease in amplitude level of the input signal $S_{0a}'$ is output from the IIR digital filter 36c.

Therefore, according to the second embodiment, it is prevented that the limit cycle noises are output from the cascade connected type IIR digital filter when the amplitude level of the digital filter on the front stage side was reduced to a value near zero.

On the other hand, since the adders 30a to 30c and the limit cycle suppression signal generating circuits 32a to 32c can be constructed by digital circuits, the operations are stable and those circuits can be easily realized by an IC.

In the second embodiment, when the frequency component of the digital limit cycle suppression signal $LI_a'$ exists in the rejection band of the IIR digital filter 36a, no limit cycle suppression signal component is output from the IIR digital filter 36a. Therefore, by providing the adder 30b to the front stage of the IIR digital filter 36b at the second stage as shown in FIG. 5, it is necessary to add the digital limit cycle suppression signal $L_{Ib}'$ to the output digital signal of the IIR digital filter 36a at the front stage and to input the addition signal to the IIR digital filter 36b at the second stage. However, on the other hand, when the frequency component of the limit cycle suppression signal $L_{Ia}'$ exists in the pass band of the IIR digital filter 36a, the limit cycle suppression signal component is output from the IIR digital filter 36a. Therefore, if the amplitude level of the limit cycle suppression signal component is properly set, the adder 30b and the limit cycle suppression signal generating circuit 32b can be omitted.

With respect to the adders 30c and the limit cycle suppression signal generating circuit 32c as well, they can be also omitted as necessary in a manner similar to the above.

Further, for example, when the digital limit cycle suppression signal $L_{Ia}'$ generated by one limit cycle suppression signal generating circuit 32a is properly set for all of the IIR digital filters 36a to 36c, by inputting the digital limit cycle suppression signal $L_{Ia}'$ to the adders 30b and 30c, the other limit cycle suppression signal generating circuits 32b and 32c can be also omitted.

In such a cascade connected type IIR digital filter, there is also a stage in which even if a limit cycle suppression signal is not input, no limit cycle phenomenon occurs.

At this time, with regard to the stage in which no limit cycle phenomenon occurs, the adder and the limit cycle suppression signal generating circuit can be omitted.

In each of the above embodiments, the additions have been executed by using the adders 36 and 36a to 36c. However, the same effect is also obtained by executing the subtractions by using subtracters.

EFFECTS OF THE INVENTION

According to the digital filter of the invention, the digital filter comprises: the IIR digital filter; the limit cycle suppression signal generating means for generating the limit cycle suppression signal whose amplitude level is larger than the critical input amplitude level in the dead band input range in which the output of the IIR digital filter is set to the dead band amplitude level and whose frequency component exists in only the useless frequency band of the input/output signal system of the digital filter; and the adding (subtracting) means for adding (subtracting) the input signal which is input to the IIR digital filter and the limit cycle suppression signal and for inputting to the IIR digital filter. Therefore, the input amplitude of the IIR digital filter is always held to the critical input level or higher irrespective of the amplitude level of the input signal. Even if the amplitude level of the input signal is set to a level near zero, the occurrence of the limit cycle phenomenon can be suppressed without exerting an adverse influence on the necessary frequency band of the signal system. Thus, there is no need to increase the bit length nor to limit the filter characteristics.

On the other hand, in the case where the frequency component of the limit cycle suppression signal is set into only the rejection band of the IIR digital filter, there is also no need to provide any additional circuit to eliminate the limit cycle suppression signal component on the post stage side of the digital filter.

Further, by setting the frequency of the limit cycle suppression signal to a frequency which is n/2 (n = 1, 3, 5, ...) times as high as the sampling frequency of the IIR digital filter, the limit cycle suppression signal can be formed from the sampling clocks by a simple circuit construction. When the IIR digital filter is an LPF or a BPF, since the limit cycle suppression signal is attenuated in the region of the digital signal, there is no need to provide a circuit to eliminate the limit cycle suppression signal component to the post stage side of the digital filter and the whole circuit can be simplified.

Among the stages of the cascade connected type IIR digital filters, by inputting the limit cycle suppression signal to the IIR digital filter at the necessary stage, even in the cascade connected type IIR digital filters, it is possible to prevent that the limit cycle noises are generated in the output.

What is claimed is:

1. A digital filter comprising:
   an IIR digital filter;
   limit cycle suppression signal generating means for generating an AC limit cycle suppression signal whose amplitude level is larger than a critical input amplitude level in a dead band range due to occurrence of zero-input limit cycle; and
   adding (subtracting) means for adding (subtracting) an input signal to be supplied to the IIR digital filter and the limit cycle suppression signal and for inputting the addition (subtraction) result signal to the IIR digital filter through a digitalization.

2. A digital filter according to claim 1, wherein the frequency component of the limit cycle suppression signal exists in only a rejection band of the IIR digital filter.

3. A digital filter according to claim 1, wherein a frequency of the limit cycle suppression signal is set to a frequency which is n/2 (n=1, 3, 5, ...) times as high as a sampling frequency of the IIR digital filter.

4. A digital filter according to claim 1, wherein the digital filter comprises a plurality of stages of cascade connected IIR digital filters, and the suppression signal generating means and the adding (subtracting) means are provided for only the stages of the IIR digital filters which need a supply of the limit cycle suppression signal.

5. A digital filter according to claim 1, wherein the frequency component exists outside the input signal frequency band.

* * * * *